Nov. 5, 1963 M. M. MERLEN 3,109,943

TEMPERATURE AND GAIN INSENSITIVE BI-STABLE TRANSISTOR TRIGGER CIRCUIT

Filed Dec. 2, 1960

INVENTOR.
MONTY M. MERLEN
BY Robert Ames Norton
ATTORNEY

United States Patent Office 3,109,943
Patented Nov. 5, 1963

3,109,943
TEMPERATURE AND GAIN INSENSITIVE BISTABLE TRANSISTOR TRIGGER CIRCUIT

Monty M. Merlen, Stamford, Conn., assignor to Barnes Engineering Company, Stamford, Conn., a corporation of Delaware Filed Dec. 2, 1960, Ser. No. 73,395
3 Claims. (Cl. 307—88.5)

This invention relates to an improved transistorized trigger or squaring circuit.

A number of bistable circuits have been developed for triggering responses at predetermined voltage levels, transforming sine waves into square waves and the like. Among these circuits the two transistor so-called "Schmitt trigger" is one of the most useful. In addition to the two transistors and the power supply, this circuit requires a minimum of five additional resistors. The input is to the base of the first transistor with an output from the collector of the second. The circuit will be described in detail below in conjunction with a discussion of the differences from the circuit of the present invention.

At this point, however, it is important to point out more generally some of the drawbacks of the "Schmitt trigger" circuit. Since the circuit connects the emitters of the two transistors together the voltage at which the circuit triggers, both positive and negative, is affected by the gains and terminal impedances of either transistor. This means that any initial adjustment requires careful balancing of resistors with transistor gain and, what is very much more serious, the voltages at which the trigger circuit operates change with the gains of the transistors. This is an extremely serious drawback. Transistors age with some change in gain and impedances, and during operation, the gain of the transistor is quite markedly influenced by ambient temperatures. Unless, therefore, the circuit is thermostated, an expensive and for many purposes impractical procedure, there is a considerable variation in the voltage at which the circuit triggers. This can be a very serious matter in the case of a precision instrument. Another problem is posed by maintenance. While transistors are reliable, sometimes they wear out. In a Schmitt trigger circuit if a new transistor is to replace the old input transistor, it is either necessary to select from a very large number of transistors one that has the exactly same gain as the old one, or else the whole circuit must be recalibrated which in some instances requires rebuilding the circuit using new resistors. In spite of the disadvantages pointed out above, the Schmitt trigger circuit is still considered the best available for many uses.

The present invention is effectively at peak accuracy regardless of gain changes in the transistors due to temperature or aging. Also, transistors can be replaced without any change in the circuit and the calibration initially obtained remains.

Essentially, in the present invention the input transistor is provided with an emitter resistor and the emitter of the second or output transistor is connected to the emitter of the first through a resistance whose value is relatively large compared to the emitter impedances of the transistors. Also, direct coupling of collector of the input transistor to the base of the output transistor is normally used. This makes a circuit in which only three resistors are used instead of at least five in the Schmitt trigger circuit. The two resistors are omitted without omitting their function for the result obtained is at least, or in fact as pointed out above, much more reliable and accurate. It is only necessary to match two of the resistors, namely the collector resistor of the first transistor, and the resistor connecting the emitters, or to have a pair of predetermined ratio. Within wide limits their absolute values do not enter into the situation. The gain of the input transistor is relatively inmaterial and the output is from the emitter of the output transistor instead of from the collector, with the advantages of the low impedance and good power gain of the resulting emitter follower configuration.

If the collector resistor of the first transistor is equal to the resistor connecting the two emitters then there will be only one triggering voltage, that is to say, if there is a slight change in one direction the circuit will flip and in the opposite direction it will flop. If the resistor connecting the two emitters is made considerably smaller than the collector resistor there will be two triggering voltage levels one for flipping and one for flopping. In either case the level or levels of the triggering voltages can be changed at will during the use of the circuit without affecting any difference between the triggering levels or other characteristics of the circuit. A very simple way of producing this result is to provide a variable emitter resistor for the first transistor. More complicated methods include an additional power supply to the emitter resistor. It is also possible to vary the output of the circuit without varying the trigger voltage levels by varying the voltage on the collector of the output transistor. These possibilities are an advantage of the present invention and are unaffected by the gain of the transistors, which is a serious shortcoming of the Schmitt trigger circuit.

In general, the present invention may be used for any purpose for which a triggering circuit such as the Schmitt trigger can be use. It performs the same functions but in a more reliable manner. An additional advantage is that the circuit of the present invention is considerably cheaper to build and adjust, a real practical advantage though, of course, not of such pre-eminent importance as the increased reliability and precision of the circuit. At the same time, these improved results are obtained without any offsetting disadvantages, thus, presenting the rare situation when an improvement is made without any offsetting compromise being necessary.

The invention will be described in greater detail in conjunction with the drawings in which.

Figure 1:
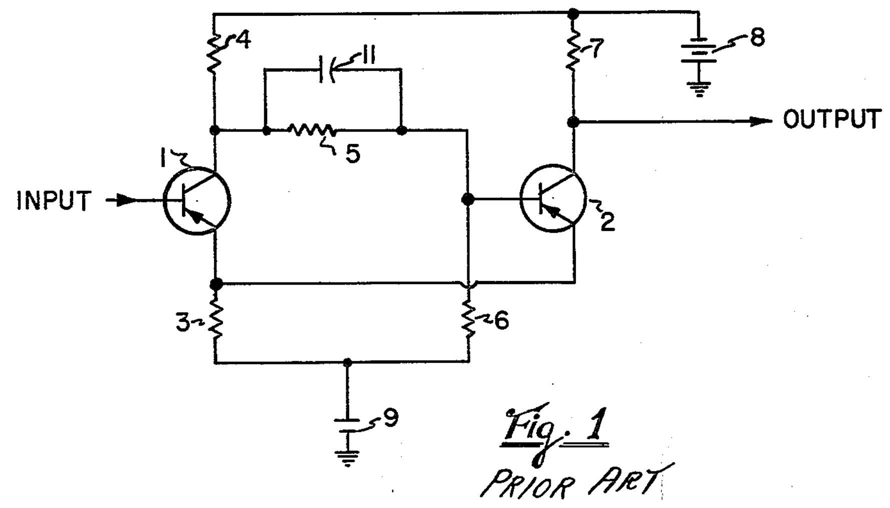
Fig. 1 PRIOR ART
FIG. 1 is a schematic of a typical Schmitt trigger circuit.

In FIG. 1 the conventional Schmitt trigger circuit is shown with input transistor 1 and output transistor 2. The input is to the base of transistor 1 and the output from the collector of transistor 2. A common emitter resistor 3 is provided for both transistors which have their emitters connected together. A collector load resistor 4 connects a collector battery 8 to the collector of the first transistor, while a bias battery 9 connects the bottom of the emitter resistor 3 to ground. These are shown as two batteries for clarity, but, of course, in practice a single battery can be used with a ground tap. The output transistor 2 has a collector resistor 7 and the coupling from the collector of transistor 1 to the base of the transistor 2 is through a voltage divider formed of the resistors 5 and 6 which connect the collector of the first transistor to the bottom of its emitter resistor 3. Where improved high frequency switching response is desired, a capacitor 11 can shunt the resistor 5.

In its quiescent state transistor 1 is cut off and its collector is, therefore, intermediate between the negative voltage of the battery 8 and the positive voltage of battery 9. As this relatively negative voltage is coupled to the base of the transistor 2 through the resistor 5, transistor 2 conducts and the output voltage is thus at a minimum determined by the values of the resistors 3 and 7, the voltage of battery 9 and the voltage on the base of transistor 2.

The delicate and complicated interrelationships of these parameters constitutes one of the difficulties of properly designing a Schmitt trigger circuit.

When a sufficient negative signal is applied to the base of transistor 1 the transistor begins to conduct lowering the voltage on its collector which in turn changes the voltage on the base of transistor 2. This reduces the current through the transistor, which further reduces the voltage drop in resistor 3 until the regenerative action finally drives transistor 1 into conduction and transistor 2 is driven just past cut off. The voltage on the collector on this latter transistor then rises substantially to that of the battery 8 and the output shows maximum voltage. The condition remains until the input to transistor 1 becomes sufficiently positive to reduce the current flow through this transistor and the same regenerative action rapidly switches the circuit back to its initial state.

It will be noted that the value of input voltage which causes switching from state to state is determined, among other things, by transistor gain and any change in the transistor gain will change this voltage. This results in the drawbacks which have been mentioned previously. Initial calibration requires balancing transistor gains with resistance values in accordance with a complicated formula or cut and try methods. When a transistor wears out the replacement transistor must either be a perfect match in gain for the one it replaces or the whole circuit has to be recalibrated which may require changing the values of resistors 4, 5 and 6. A further disadvantage in some instances is that the impedance of the output circuit can be relatively high. For some purposes this is not particularly material but for other uses it constitutes a drawback to the Schmitt trigger circuit.

The problems have been discussed in terms of required input voltage at which triggering takes place. It should be noted that when the trigger circuit is used to transform a sine wave into a square wave, any change in triggering level not only appears as such but results in a change of wave characteristics. The resulting square wave is, therefore, not in the same relation to the input sine wave when transistor gain changes with temperature or other factors.

Figure 2:
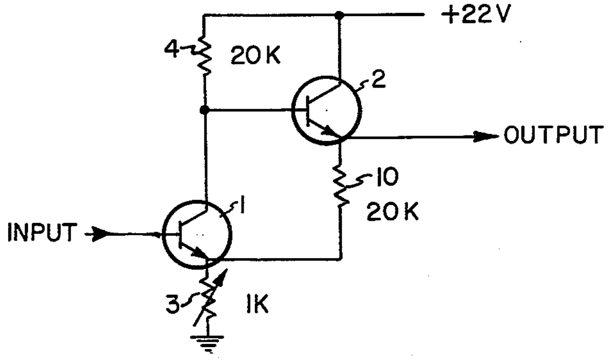
FIG. 2 is a schematic of a typical circuit according to the present invention.

FIG. 2 shows the simple circuit of the present invention. The same parts bear the same numbers as in FIG. 1. The input transistor 1 is connected directly to ground through an emitter resistor 3 which is shown as a variable 1K resistor although it may be fixed. The collector resistor 4 of transistor 1 is shown as 20K and the collector of the first transistor is directly coupled to the base of the second or output transistor 2. The collector of this transistor is directly connected to the source of supply, shown as 22 volts, and the collector resistor 7 which was necessary in the Schmitt trigger circuit of FIG. 1 is eliminated. The emitter of the transistor 2 is connected to the emitter of transistor 1 through a 20K resistor 10 which takes the place of the two resistors 5 and 6 of FIG. 1. The large value of resistor 10 masks variations in emitter impedances and gains of both transistors. Output is from the emitter of the second transistor instead of from the collector, and so presents a low impedance. It will be seen that three resistors replace the five resistors of FIG. 1 but no functions of the replaced resistors are eliminated. In fact, the overall results are superior as will be brought out.

It will be noted that the current through the emitter resistor 3 is constant regardless of which transistor is conducting. Let us assume that the current is 1 ma. and that the resistor 3 is set at its 1K resistance. The voltage drop will then be 1 volt across either transistor, 20 volts across either resistor 4 or 10, and 1 volt across resistor 3. The triggering voltage level on the base of transistor 1 is between 1.2 and 1.6 volts, depending on the transistor type. As soon as this level is exceeded the voltage on the collector begins to drop as does the voltage on the base of transistor 2 which is directly coupled thereto. Conduction of transistor 2 decreases thus decreasing voltage drop through resistor 10 which causes a further increase in conduction of transistor 1 and this regenerative effect causes the circuit to assume its second stable state with transistor 1 conducting. The reverse operation will take place when the signal on the base of transistor 1 drops just below the trigger level. This will reduce conduction on 1, begin conduction on 2, and the circuit will switch over. The output voltage from the emitter of transistor 2 will vary from just over 1 volt to 20 volts. If a sine wave is applied to the base of transistor 1 the output will be a square wave triggered exactly at the trigger level point which will determine the wave characteristics with respect to the sine wave.

The operation depends practically only on the values of the resistors. Transistor gain hardly enters in at all and a wide change in gain of transistor 1 or 2, or both, due to temperature changes, ageing, or any other reason, does not affect the point at which the trigger operates. The circuit has been shown with resistors 4 and 10 of the same value and with the same voltage, 22 volts, supplying both transistors. Resistor 10 sets the trigger level of one state while resistor 4 sets the trigger level of the other state. The trigger level settings are noninteracting. If equal values of resistors are used, as illustrated in FIG. 2, the trigger levels of the two states are so nearly identical that the difference is negligible in practical operation. This will remain the same in spite of variations in transistors. The great stability and design simplicity are important advantages as compared with the Schmitt triggering circuit where the performance is affected by transistor characteristics and the initial adjustment is extremely complex.

The output has been shown as a 20 volt swing. This is not necessary. If a different voltage supply is used for the collector of transistor 2, the output voltage swing can be changed. Suppose 12 volts are used, then the output voltage swing will be 10 volts instead of 20 volts. Also the triggering voltage of both states can be changed by varying the value of resistor 3 or by changing the supply voltage. This latter may render a Schmitt trigger circuit inoperable unless the whole circuit is redesigned. If the resistors 4 and 10 are of different values then there will be two different triggering voltage levels. The value of resistor 4 determines flip triggering voltage and resistor 10 flop triggering levels. Variations in resistance values can be made within fairly wide limits but care should be taken that the resistor 10 is not reduced to too low a value. The important advantage of the circuit, namely that triggering voltage levels are not significantly affected by changes in transistor characteristics, is achieved by making resistor 10 sufficiently large so that in comparison with it the impedance of the input transistor emitter circuit is so much smaller that any change has negligible effect.

The present invention is useful with any transistors except, of course, that the output voltage is limited by the maximum collector voltage which the particular type of transistor permits. It is immaterial what the general type of transistor is. This is borne out by considering that the Schmitt triggering circuit is illustrated with PNP transistors whereas the circuit of FIG. 2 uses NPN transistors. The operation is exactly the same, the only change being, of course, the polarity of the supply voltages.

I claim:

1. A transistor circuit comprising in combination, (*a*) an input transistor, input means connecting to the base thereof, and an output transistor, (*b*) the input transistor having a collector resistor and an emitter resistor, (*c*) collector supply voltages for said transistors the supply voltage for the output transistor being directly connected to the collector thereof and the supply voltage for the input transistor being connected to the collector resistor, (d) a resistor connecting the emitters of the two transistors, (e) means for directly coupling the collector of the input transistor to the base of the output transistor, and (f) output means connected in the emitter circuit of the output transistor.

2. A circuit according to claim 1 in which both transistors are supplied from the same voltage source.

3. A trigger circuit according to claim 2 in which the collector resistor of the first transistor is matched to the value of the resistor connecting the two emitters.

References Cited in the file of this patent

UNITED STATES PATENTS

| | | |
|---|---|---|
| 2,789,217 | Lacy | Apr. 16, 1957 |
| 2,986,650 | Wolfendale | May 30, 1961 |